United States Patent [19]
Shishiguchi

[11] Patent Number: 5,470,780
[45] Date of Patent: Nov. 28, 1995

[54] METHOD OF FABRICATING POLY-SILICON RESISTOR

[75] Inventor: Seiichi Shishiguchi, Tokyo, Japan

[73] Assignee: NEC Corporation, Tokyo, Japan

[21] Appl. No.: 298,958

[22] Filed: Sep. 1, 1994

[30] Foreign Application Priority Data

Sep. 16, 1993 [JP] Japan ................................ 5-230366

[51] Int. Cl.$^6$ ................................................. H01L 21/70
[52] U.S. Cl. ........................... 437/60; 437/82; 437/918; 148/DIG. 136
[58] Field of Search ............................. 437/60, 918, 82; 148/DIG. 136

[56] References Cited

U.S. PATENT DOCUMENTS

| | | | |
|---|---|---|---|
| 4,081,292 | 3/1978 | Aoki et al. | 148/1.5 |
| 4,302,763 | 11/1981 | Ohuchi et al. | 257/49 |
| 4,344,985 | 8/1982 | Goodman et al. | 437/244 |
| 4,349,408 | 9/1982 | Tarng et al. | 156/628 |
| 4,380,773 | 4/1983 | Goodman | 257/387 |
| 4,467,519 | 8/1984 | Glang et al. | 148/1.5 |
| 4,489,103 | 12/1984 | Goodman et al. | 427/85 |
| 5,141,892 | 8/1992 | Beinglass | 437/233 |
| 5,168,076 | 12/1992 | Godinho et al. | 437/60 |

OTHER PUBLICATIONS

"Novel Highly Conductive Polycrystalline Silicon Films Reducing Processing Temperature Down to 650 C", *Abstracts of the 20th Conference on Solid State Devices and Materials*, Tokyo, 1988, by T. Kobayashi et al., pp. 57–60.
"A New Silicon Heterojunction Transistor Using the Doped Sipos", *IEEE 1979 Tech.* by N. Oh–uchi et al., pp. 522–525.

*Primary Examiner*—Brian E. Hearn
*Assistant Examiner*—Trung Dang
*Attorney, Agent, or Firm*—Young & Thompson

[57] ABSTRACT

The method of fabricating a poly-silicon resistor includes a step for providing a dopant gas and a nitrous oxide gas as well as a silane gas to thereby deposit a silicon layer on a substrate by chemical vapor deposition under a deposition temperature not higher than 600 degrees centigrade so that the silicon layer includes the dopant of the dopant gas and oxygen, and a step for annealing the silicon layer under a temperature not lower than 600 degrees centigrade.

6 Claims, 4 Drawing Sheets

METHOD OF FABRICATING POLY-SILICON RESISTOR

BACKGROUND OF THE INVENTION

1. Field Of The Invention

The invention generally relates to a method of fabricating a semiconductor device, and more particularly to a method of fabricating a resistor fabricated from a polysilicon layer.

2. DESCRIPTION OF THE RELATED ART

A thin polysilicon layer plays an important role as an electrode, a material for wire lead and a resistor in manufacturing a semiconductor device. In particular, a polysilicon resistor is used as a loading element of SRAM (static RAM) and a voltage dividing element of an analog device.

A conventional method of fabricating such a polysilicon resistor includes a step for depositing a non-doped silicon layer by chemical vapor deposition, and a step for doping impurities into the silicon layer by phosphorus diffusion or ion implantation. Another conventional method of fabricating a polysilicon resistor includes a step for depositing an in-situ impurity-doped silicon layer by chemical vapor deposition in which a dopant gas is to be supplied together with a silane gas, and a step for annealing to thereby fabricate a resistor. In particular, the latter method is considered to be mainly used due to its low process cost. For instance, see Abstracts of the 20th Conference on Solid State Devices and Materials, 1989, pp. 57–60.

In this method, first, a deposition is performed for 60 minutes using a conventional low-pressure chemical vapor deposition (LPCVD) apparatus, for instance, in the following conditions:

Deposition Temperature: 570 degrees centigrade or below

Degree of Vacuum: 0.5 Torr

Process Gas: Monosilane ($SiH_4$) 1000 sccm.
He-based 4% $PH_3$ 50 sccm

By the above mentioned deposition, there is fabricated a phosphorousdoped silicon layer having a thickness of 200 nanometers. Next, the silicon layer is annealed, for instance, for 30 minutes under the temperature of 900 degrees centigrade to thereby activate phosphorus to obtain a phosphorus-doped polysilicon layer. Then, the polysilicon layer is subject to a patterning step using a photoresist, and thus a polysilicon resistor is fabricated.

Though not a method of fabricating a resistor, a method of fabricating an impurity-doped polysilicon layer includes a method of doping phosphorus atoms into SIPOS (Semi Insulating Polycrystalline Silicon). For instance, see IEEE 1979 Tech. Dig. pp. 522. In this method, there is fabricated a polysilicon layer in which 44 at. % of oxygen and 0.6 at. % of phosphorus are doped, through a chemical vapor deposition process under the condition that the deposition temperature is 650 degrees centigrade and the process gas is $N_2$-$SiH_4$-$N_2O$-$PH_3$.

A resistor to be used for a semiconductor device is required to have stable electrical properties. In particular, a voltage dividing element for use with an analog device is required to have a polysilicon resistor having a high accuracy because a voltage is divided in accordance with a relative resistance ratio of the resistor to an adjacent resistor. For instance, it is necessary to lower a dispersion of a relative resistance ratio (a/b) under ±1% between adjacent resistors A having a Ω. cm of resistance and B having Ω. cm of resistance.

The electrical properties of a polysilicon resistor are significantly affected by properties of crystal grains, such as grain diameter and crystallinity, which constitutes the resistor. For instance, the electrical resistance of a polysilicon layer is significantly varied by the decrease in the number of conductive carriers due to unbalanced distribution of dopant impurities in a grain boundary, and the decrease of carrier mobility due to grain boundary diffusion. Accordingly, it is important to keep the grain boundary density present in an electrically conductive region to be uniform as much as possible in order to fabricate a resistor made of polysilicon and having stage electrical properties. In other words, it is important to arrange the number of crystal grains present in polysilicon resistors to be identical to one another. However, since the number of crystal grains has always a statistical dispersion, the dispersion in the number of crystal grains is increased with the absolute number of crystal grains being decreased.

With the increasing integration of a semiconductor device, a o resistor size is decreased accordingly. Thus, a diameter of a crystal grain of polysilicon fabricated in accordance with a conventional method is close to the size of the resistor. For instance, a resistor size is a few micrometers whereas the diameter of a crystal grain is hundreds of nanometers. Consequently, the uniformity of resistance of a resistor fabricated in accordance with a conventional method deteriorates with the increasing integration of LSIs.

The above mentioned method in which phosphorus atoms are doped into SIPOS aims to enlarge a band gap of a semiconductor, however, a polysilicon layer fabricated in accordance with this method includes tens of percent of oxygen atoms, resulting in that the polysilicon layer has a high resistivity to thereby make it difficult to apply the polysilicon to a resistor.

SUMMARY OF THE INVENTION

In view of the foregoing problems, it is an object of the present invention to provide a method of fabricating a polysilicon resistor having a crystal grain diameter sufficiently smaller than a resistor size and also having a sufficiently small resistivity.

The invention provides a method of fabricating a polysilicon resistor including a step for providing a dopant gas and a nitrous oxide gas as well as a silane gas to thereby deposit a, poly-silicon layer on a substrate by chemical vapor deposition under a deposition temperature not higher than 600 degrees centigrade, the poly-silicon layer including the dopant of said dopant gas and oxygen, and a step for annealing the poly-silicon layer under a temperature not lower than 600 degrees centigrade.

In a preferred embodiment, the silane gas includes a monosilane gas ($SiH_4$) and a disilane gas ($Si_2H_6$).

In another preferred embodiment, the dopant gas includes a phosphine gas ($PH_3$), an arsenic gas ($ASH_3$) and a diborane gas ($B_2H_6$).

In still another preferred embodiment, the poly-silicon layer is a N-type one.

In yet another preferred embodiment, the poly-silicon layer is a P-type one.

In still yet another preferred embodiment, the resistivity of the poly-silicon layer is varied in dependence on flow rates of the nitrous oxide gas and dopant gas.

In further preferred embodiment, the poly-silicon layer includes the dopant at a concentration not higher than 1 at. % and the oxygen at a concentration not higher than 1 at. %.

The advantages obtained by the aforementioned present s invention will be described hereinbelow.

In fabricating a polysilicon layer using a silane gas through a chemical vapor deposition process, a dopant gas and a nitrous oxide gas are supplied together with a silane gas to thereby deposit a poly-silicon layer including the dopant and oxygen through a chemical vapor deposition process under a deposition temperature equal to or below 600 degrees centigrade. Then, the poly-silicon layer including the dopant and oxygen is annealed under the temperature equal to or above 600 degrees centigrade to fabricate a polysilicon resistor.

The resistor fabricated in accordance with the method is characterized by that the resistor has a smaller crystal grain diameter than that of a resistor fabricated in accordance with a conventional method, and that a change in a crystal grain diameter is slight in subsequent processes.

Accordingly, even in a resistor having a few micrometers o size, the number of crystal grains can be made larger to thereby make it possible to obtain improved uniformity of resistance.

The above and other objects and advantageous features of the present invention will be made apparent from the following description made with reference to the accompanying drawings, in which like reference characters designate the same or similar parts throughout the drawings. BRIEF DESCRIPTION OF THE DRAWINGS FIGS. 1A, 1B and 1C are a series of cross-sectional views showing steps for fabricating a polysilicon resistor in accordance with an embodiment 1 of the present invention.

DESCRIPTION OF THE PREFERRED EMBODIMENTS

Preferred embodiments in accordance with the present invention will be explained hereinbelow with reference to drawings.

EMBODIMENT 1

Figure 1A:
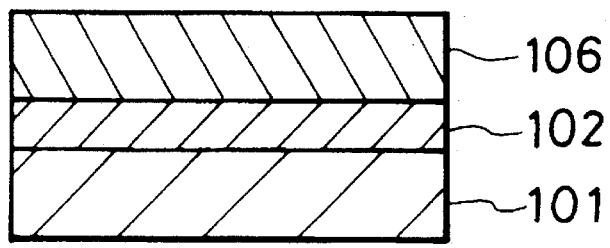
Figure 1B:
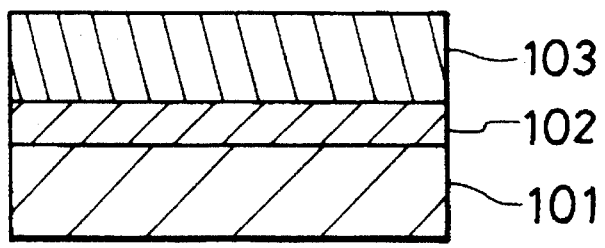
Figure 1C:
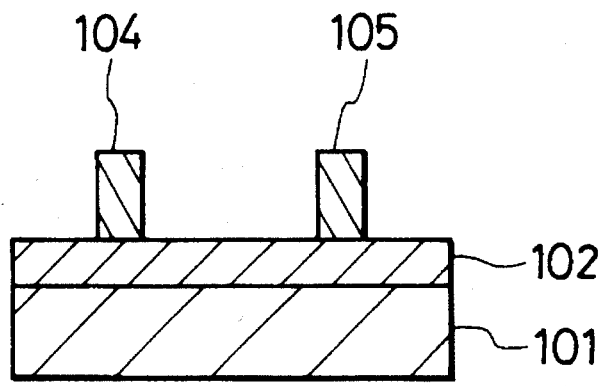

FIGS. 1A to 1C are cross-sectional views showing steps in order of a method in accordance with the invention. First, as illustrated in FIG. 1A, an oxide film 102 approximately 100 nanometers thick is formed on a P-type silicon substrate 101, for instance, having a plane orientation of [100] and a resistivity of 1 $\Omega$.cm. Then, on the oxide film 102 is formed an oxygen and phosphorus concurrently doped N-type silicon layer 106 having approximately 200 nanometers of thickness by means of a conventional vertical LPCVD apparatus.

The silicon layer 106 is formed under the condition, for instance, of a reaction tube temperature being 570 degrees centigrade and a pressure being 0.5 Torr. In addition, there are supplied for 60 minutes as a source gas 1000 sccm of a monosilane gas ($SiH_4$), 50 sccm of 4% $PH_3$ (He-based) and 5 sccm of $N_2O$.

Then, as illustrated in FIG. 1B, a resultant is heated for 30 minutes under the temperature of 950 degrees centigrade in an electric furnace to thereby turn the silicon layer 106 into a polysilicon layer 103 including oxygen and phosphorus therein. The thus fabricated polysilicon layer includes approximately 1 at. % of phosphorus atoms and has approximately 2 m$\Omega$. cm of resistivity. The concentration of oxygen is below 1 at. %. The resistivity of the polysilicon layer can be controlled by flow rates of $N_2O$ and $PH_3$. It is desired for the polysilicon layer to have the phosphorus concentration being about 1 at. % and the oxygen concentration being about 1 at. % in order to use the polysilicon layer as a low resistive resistor which the present invention intends to provide.

Then, as illustrated in FIG. 1C, the polysilicon layer is subject to a patterning step by means of a photolithography to thereby form polysilicon resistors 104 and 105.

Figure 2:
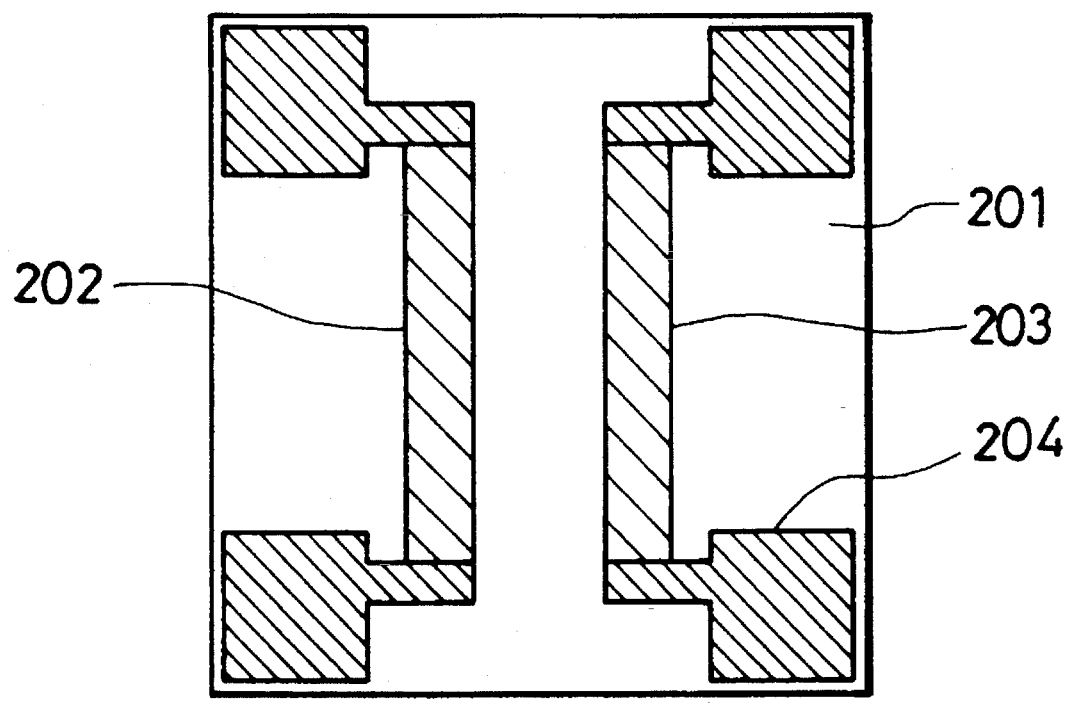
FIG. 2 is a plan view illustrating a pattern for evaluating a resistance of a polysilicon resistor fabricated in accordance with embodiments 1 and 2 of the present invention.

FIG. 2 is a plan view of a pattern for measuring the electrical resistance of the polysilicon resistor fabricated in accordance with the above mentioned method. The resistors are evaluated by comparing a dispersion of relative resistance ratios of hundred resistors, including a resistor A 202 and a resistor B 203, being present in a wafer and having various sizes. The width of the resistors are between 1 and 10 micrometers, and the length is ten times as long as the width. The separation between the resistor A and the resistor B on a silicon oxide film 201 is three times as long as the width of the resistor. A reference numeral 204 indicates a polysilicon electrode.

Figure 3:
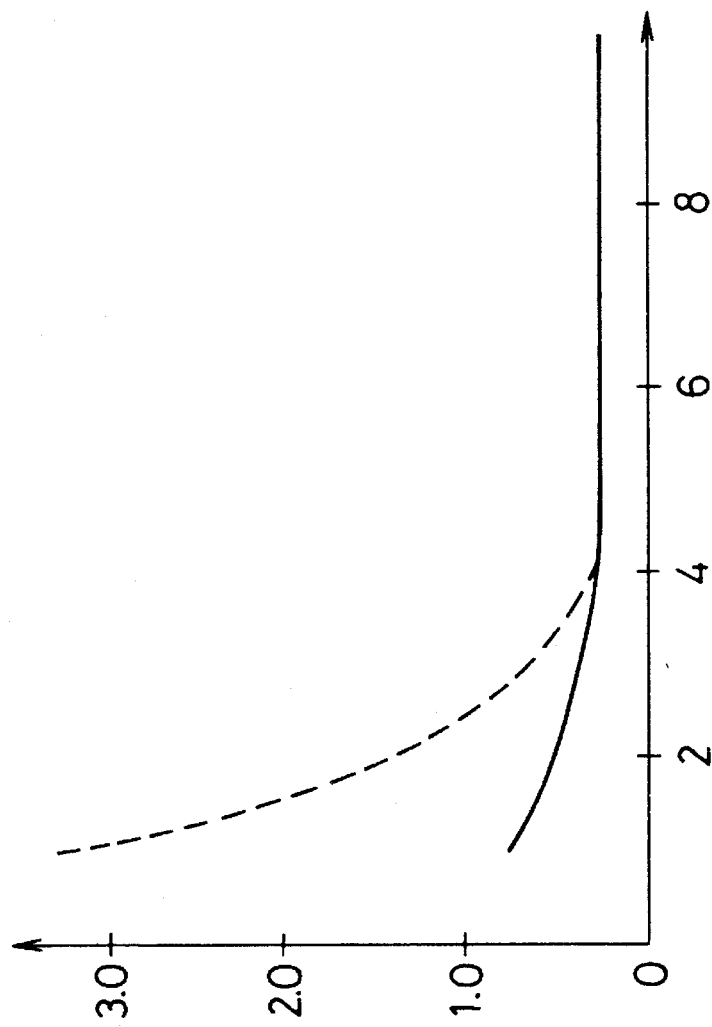
FIG. 3 is a graph showing a dispersion of resistance of both a resistor fabricated in accordance with an embodiment 1 of the present invention and a resistor fabricated in accordance with a conventional method.

FIG. 3 shows a dispersion of relative resistance ratios relative to a resistor size. In the resistor fabricated in accordance with the invention, a dispersion is lowered below 1% even when the width of the resistor is decreased to 1 micrometer, whereas in a resistor fabricated in a conventional method, the dispersion is highly increased with the decreasing width of the resistor. This results shows that the invention improves the dispersion of the resistors.

With respect to a resistor 1 micrometer wide, the crystal grain diameter was measured by a transmission type electron microscope. Whereas a resistor fabricated in accordance with a conventional method has approximately 1 micrometer of crystal grain diameter, a resistor fabricated in accordance with the invention has approximately 0. 1 micrometer of crystal grain diameter. Thus, it has been confirmed that the improvement of the resistor dispersion is caused by that the decreased crystal grain diameter results in the increased number of crystal grains present in a resistor to thereby decrease the statistical dispersion in the number of crystal grains.

EMBODIMENT 2

The embodiment 1 relates to a phosphorus-doped N-type resistor. It is expected for a P-type resistor to have the same advantageous effects as those of an N-type resistor. A P-type resistor is to be fabricated in the same way as that of the embodiment 1 except the step for forming a polysilicon layer. A polysilicon layer is formed by means of a conventional vertical LPCVD apparatus under the condition of, for instance, a temperature of a reaction tube at 450 degrees centigrade, a pressure at 0.5 Torr, a source gas including 100 sccm of $SiH_4$,50 sccm of 1% $B_2H_6$ (He-based) and 1 sccm of $N_2O$. Similarly to the embodiment 1, in the embodiment 2, the dispersion of relative resistance ratio can be lowered below 1% even when the width of the resistor is decreased to 1 micrometer.

EMBODIMENT 3

In order to compare the method in accordance with the invention with a conventional method in which phosphorus is doped into SIPS, on a silicon substrate on which a silicon oxide film having 100 nanometers of thickness is formed, is formed a polysilicon layer having 200 nanometers of thickness in accordance with both the present invention and a conventional method. The conditions for deposition in the present invention were the same as those in the embodiment 1. That is, the polysilicon layer in accordance with the invention is formed under the condition of a reaction tube temperature of 570 degrees centigrade, a pressure of 0.5 Torr, and a source gas being supplied including 1000 sccm of a monosilane gas ($SiH_4$), 50 sccm of 4% $PH_3$(He-based) and 5 sccm of $N_2O$. The polysilicon layer in accordance with a conventional method is formed under the condition of a deposition temperature at 650 degrees centigrade and a source gas being supplied including 30 sccm of a monosilane gas ($SiH_4$), 50 sccm of 4% PHs (He-based) and 5 sccm of $N_2O$.

Figure 4:
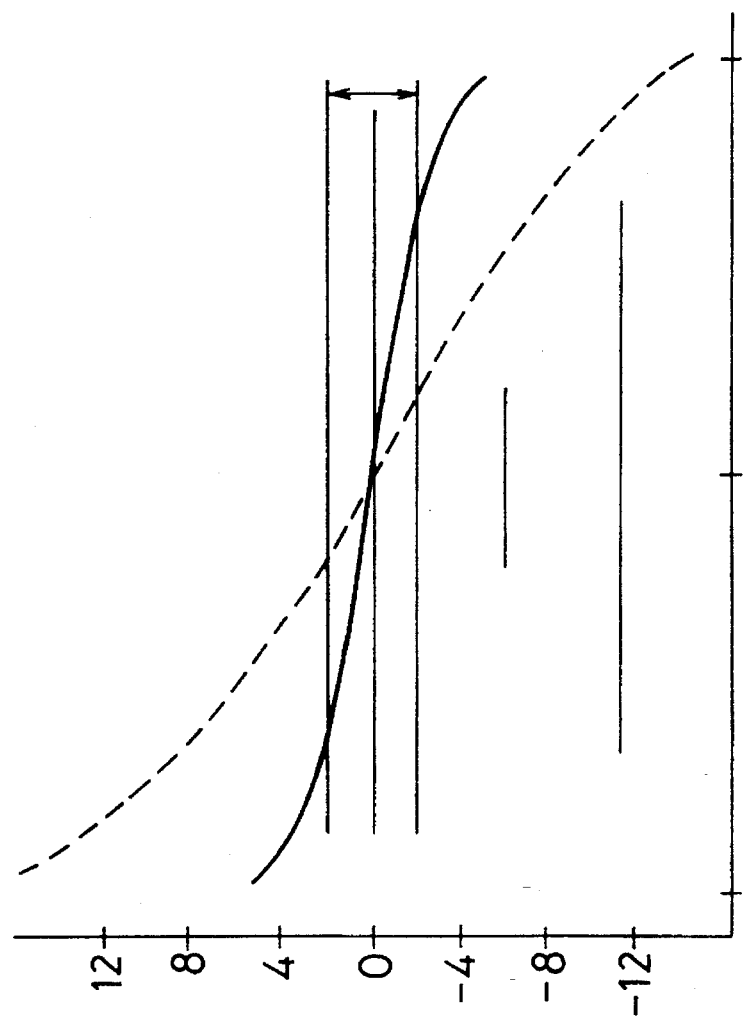
FIG. 4 is a graph showing a dispersion of the oxygen concentration in poly-silicon layers fabricated in accordance with embodiments 1 and 2 and a conventional SIPOS process.

FIG. 4 shows the relationship between the location of a substrate measured in a longitudinal direction of a reaction tube and the oxygen concentration in the polysilicon layer. In a conventional method, a region in which the oxygen concentration is uniform ranges only in 50 substrates, whereas such a region ranges in 150 substrates in the present invention. It is considered that since the deposition temperature is high in a conventional method, the reaction speed in a gas phase of the source gas N2O is high, and hence the source gas concentration is much varied in the longitudinal direction of a reaction tube, resulting in that the uniformity of the polysilicon layer is deteriorated.

The surfaces of the deposited silicon layers were observed through a scanning type electron microscope. The layer fabricated in accordance with the invention was found to be flat, whereas the layer fabricated in a conventional method was found to have irregularities on a surface thereof. Next, structures of the deposited silicon layers were observed through X-rays diffraction process and a transmission type electron microscope with the result that the structure in accordance with a conventional method was polysilicon (polycrystalline), whereas the structure in accordance with the invention was amorphous. In other words, since a silicon layer fabricated in accordance with a conventional method is polycrystalline, a surface of the layer is composed of crystal grains having various crystal orientations. In a layer deposition in accordance with LPCVD process, the deposition speed is varied in dependence on the crystal orientation, and hence it cannot be avoided for a conventional polycrystal deposition to have irregularities on a surface.

As mentioned so far, the present invention is characterized by an improved productivity of a resistor because a larger number of substrates per batch can be deposited than in conventional method in which phosphorus is doped into SIPOS, and also with a superior flatness of the layer surface. In addition, as stated in the section "Description of the related art", since a conventional layer fabricated by doping phosphorus atoms into SIPOS is intended to enlarge the band gap of silicon, the layer has a high resistivity, resulting in that the layer is not suitable for a resistor the invention intends to fabricate.

Although a monosilane gas ($SiH_4$) was used in the embodiment, a disilane gas ($Si_2H_6$) may be used in place of a monosilane gas. Similarly, an arsenic gas ($AsH_3$) or a diborane gas ($B_2H_6$) may be used as a dopant gas in place of a phosphine gas ($PH_3$) used in the embodiment.

In accordance with the invention, the resistor can have a smaller crystal grain diameter than that of a resistor fabricated in accordance with a conventional method, and the crystal grain diameter is not changed in subsequent processes. In addition, a resistor having a sufficiently small resistance such as 2 m$\Omega$.cm can be formed regardless of oxygen doping. Accordingly, it is possible to obtain an improved uniformity of resistance even in a resistor having a size of micrometers order.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of fabricating a poly-silicon resistor comprising the steps of:

providing a dopant gas and a nitrous oxide gas as well as a silane gas;

depositing a poly-silicon layer on a substrate by chemical vapor deposition under a deposition temperature not higher than 600 degrees centigrade, said silicon layer including the dopant of said dopant gas and oxygen; and annealing said poly-silicon layer under a temperature not lower than 600 degrees centigrade;

wherein said poly-silicon layer includes said dopant at a concentration not higher than 1 at. % and said oxygen at a concentration not higher than 1 at. %.

2. A method in accordance with claim 1, wherein said silane gas includes a monosilane gas ($SiH_4$) and a disilane gas ($Si_2H_6$).

3. A method in accordance with claim 1, wherein said dopant gas includes a phosphine gas ($PH_3$), an arsenic gas ($AsH_3$) and a diborane gas ($B_2H_6$).

4. A method in accordance with claim 1, wherein said poly-silicon layer is an N-type one.

5. A method in accordance with claim 1, wherein said poly-silicon layer is a P-type one.

6. A method in accordance with claim 1, wherein a resistivity of said poly-silicon layer is varied in dependence on flow rates of said nitrous oxide gas and dopant gas.

* * * * *